United States Patent [19]

Décailliot et al.

[11] Patent Number: 4,458,169

[45] Date of Patent: Jul. 3, 1984

[54] MICROWAVE WARMUP DEVICE FOR HF RESONATOR

[75] Inventors: Michael D. Décailliot, Pirey; Raymond J. Besson, Besançon, both of France

[73] Assignee: Etat Francais represente par le Delegue General pour l'Armement, Paris, France

[21] Appl. No.: 379,102

[22] Filed: May 17, 1982

[30] Foreign Application Priority Data

May 20, 1981 [FR] France .................................. 81 10006

[51] Int. Cl.³ ...................... H01L 23/34; H01L 41/00
[52] U.S. Cl. .................................... 310/315; 310/346; 333/234
[58] Field of Search ............... 310/315, 341, 343, 346, 310/328, 311, 342; 333/141, 245, 222, 234; 219/10.55 R, 10.55 A

[56] References Cited

U.S. PATENT DOCUMENTS 3,260,969 7/1966 Jacobsen .............................. 333/141
3,453,456 7/1969 Oltman, Jr. et al. ................ 333/141

Primary Examiner—J. D. Miller
Assistant Examiner—D. L. Rebsch
Attorney, Agent, or Firm—Parkhurst & Oliff

[57] ABSTRACT

A heating system for an HF oscillator.

The system comprises a reentrant cavity (10) controlling an UHF oscillator and sized to generate an UHF electric field with a frequency F much higher than the resonance frequency $F_O$ of the piezoelectric crystal (50) of the HF oscillator which itself is located in the space between the central core (14) and the bottom (12) of the cavity and in such a manner that the two electrodes (34,35) of the oscillator are respectively located substantially in the planes of the free end of the central core (14) and of the inside of the bottom (12) of the cavity (10). The electrodes (34,35) are located in bores (16,15) in the conducting parts of the cavity in such a manner that the peripheral part of each electrode is surrounded at close proximity but without making contact with the wall of the corresponding bore (16,15). The electrodes (34,35) are connected to an HF oscillator by insulated leads (24,25).

18 Claims, 7 Drawing Figures

MICROWAVE WARMUP DEVICE FOR HF RESONATOR

The purpose of this invention is a process and microwave fast warmup device for an HF (High Frequency) resonator consisting of a piezoelectric crystal cooperating with at least one pair of energizer electrodes generating an electric field energizing the crystal according to a resonance frequency FQ.

It is well known that the resonance frequency of a volume wave resonator (quartz crystal resonator, UHF cavity . . . ) depends firstly on the dimensions of the resonator. The stability of the resonance frequency therefore depends on the thermal balance of the resonator maintained by a thermostat, most frequently electronic. When the resonator is in quartz crystal, the cutting angle can be selected so that the law of variation in the frequency contingent on the temperature lies at a minimum: this is the turnpoint of the AT cuts. A conventional thermostat is used to bring up the temperature of the crystal to around that of the turn point and to hold it constant.

In practice, it is sometimes particularly important that the temperature build-up of the piezoelectric crystal, i.e. the warmup of the resonator to a temperature generally around that of the turn point, should take place rapidly and as homogeneously as possible, to limit the constraints inside the crystal.

In a conventional thermostat, where the thermal exchanges are through the surface, these two conditions oppose each other: fast warmup produces temperature gradients in the quartz crystal (from the surface to the center) which cause the resonator frequency to trail. Relatively homogeneous warmup, on the contrary, maintains the resonator balanced and rules out any rapid rise in temperature.

To remedy these drawbacks, internal warmup has already been proposed in the actual mass of the active resonator section through the power consumed in the motional resistance of the crystal. According to this well known process, the proposal is thus to use one of the crystal's resonance frequencies to provide the crystal with a certain internal warmup capacity in the mass. In this case, heating is produced by the piezoelectric vibration which uses the dynamic motional resistance of a resonant mode.

Although advantageous as compared to other processes, warmup through vibration at a resonance frequency of the crystal will obtain neither perfect homogeneity, given that the warmup is produced from vibration centers, nor sufficient warmup speeds.

This present invention is precisely aimed at remedying the aforesaid drawbacks and obtaining, simply, warmup of a piezoelectric crystal which is both ultrafast and fully homogeneous.

Another purpose of the invention is a process and device regulating the warmup power so as to hold a piezoelectric crystal at a given temperature with minimum energy expenditure.

These aims are attained through the fact that, in accordance with the invention, the HF resonator assembly is placed in a supplementary UHF field whose frequency F is much higher than the resonance frequency FQ of the resonator. Preferably the frequency F of the UHF electric field is at least ten times higher than the resonance frequency FQ of the resonator.

It will be noted that the application of a microwave type warmup to the temperature build-up of a quartz crystal runs up against considerable prejudices insofar as the value of the angle of loss of the quartz crystal is very low (tan $\delta \simeq 2.10^{-4}$) so that this application of a warmup through dielectric losses to the temperature buildup of an HF resonator may appear to encounter insurmountable difficulties.

Nevertheless, the invention makes it possible to benefit from all the advantages of warmup through dielectric loss, i.e. fast and homogeneous warmup, without the power necessaty's being prohibitive.

This is made possible through a device forming a warmup thermostat which comprises a re-entrant resonant cavity driving a UHF oscillator and sized so as to produce a UHF electric field of frequency F much higher than the resonance frequency FU of the piezoelectric quartz crystal, the resonator being installed in the space between the central core and the bottom of the cavity in such a way that the two electrodes in the resonator are located respectively practically in the planes of the free end of the central core and the inner face of the bottom of the cavity, at least one of the electrodes being placed in a bore made in the conductor sections of the cavity along an axis practically perpendicular to the plane of the crystal, the peripheral section of the electrode being surrounded closely, but with no contact, by the walls of the said bore, an internal conductor coaxial to the bore and insulated from it by an insulating lining being designed to couple the electrode located in the plane of the free end of the central bore to an HF oscillator designed to apply to the resonator an electric field with resonance at frequency FQ.

Preferably, at least the resonator electrode located practically in the plane of the free end of the central core is surrounded closely but without contact, by the wall of a bore made in the central core and defining an insulated external cylindrical conductor section, via an insulating lining, with reference to an internal conductor coaxial to the bore and coupling the said electrode to the HF oscillator designed to apply to the resonator an electrical field with resonance at frequency FQ.

In this case, according to a procedure specific to the invention, the resonator electrode located practically in the plane of the internal face of the bottom of the cavity is installed in a cylindrical housing made in the bottom of the cavity in the extension of the central core, the inner edge of the housing is closely around, but with no contact, the electrode located in the said housing, an internal conductor coaxial to the wall of the cylindrical housing and insulated from it by an insulating lining, also couples the electrode located in the said housing to the HF oscillator so as to energise the resonator which is serial type.

According to another procedure in the invention, one of the electrodes consists directly of the terminal face of the central core or the inner face of the bottom of the cavity and grounded in such a way as to energize the resonator, which is parallel type.

The electrodes associated to the piezoelectric crystal can be integral with the two opposite faces of the crystal located respectively opposite the free end of the central core and the bottom of the cavity.

The electrodes associated with the piezoelectric crystal can also be obtained in the form of plates installed close to the two opposite faces of the crystal, but without any contact with them.

Generally, the free spaces left between an electrode and the conductor section of the cavity surrounding the said electrode closely, but with no contact, define an impedance whose value is low versus the frequency F of the UHF field but high versus the resonance frequency FQ of the HF field. The frequency F of the UHF electric field is advantageously comprised between 500 MHz and 10 GHz.

The re-entrant form resonant cavity which, according to the invention, submits a quartz crystal resonator to an intense and uniform microwave electric field, whilst enabling the quartz crystal resonator to receive independently the electric field energizing its own resonance, in all cases provides warmup at molecular level independent of the coductibility of the quartz crystal. The microwave oven formed by the resonant cavity warms up quartz crystal resonators operating in the FQ frequency range between around 1 and 500 MHz.

According to the invention, the device thus provides a solution notably to the warmup of onboard quartz crystal resonators, which should be as fast as possible, and the warmup of metrological type quartz crystal resonators which should be as homogeneous as possible to avoid any frequency hysteresis effect. The invention also has a vast field of application in the warmup of quartz crystal clocks operating intermittently on high precision measurement instruments such as, for example: frequencymeters, computers, spectrum analyzers.

According to an especially advantageous disposition of this invention, the warmup device also contains means of modulating the frequency F of the UHF electrical field, means of detecting modulation induced on the resonance frequency FQ of the crystal and means of servo-controlling the frequency F of the UHF electric field contingent on the modulation signal detected by the said means of detection to maintain the modulation signal detected below a predetermined level thus obtaining regulation of the crystal temperature.

The warmup thermostat, according to the invention, thus employs a regulation process, especially used for notably when obtaining resonators with a very stable resonance frequency.

Other characteristics and advantages of the invention will be displayed in the description of the special production procedures, referring to in the drawings appended on which:

Figure 1:
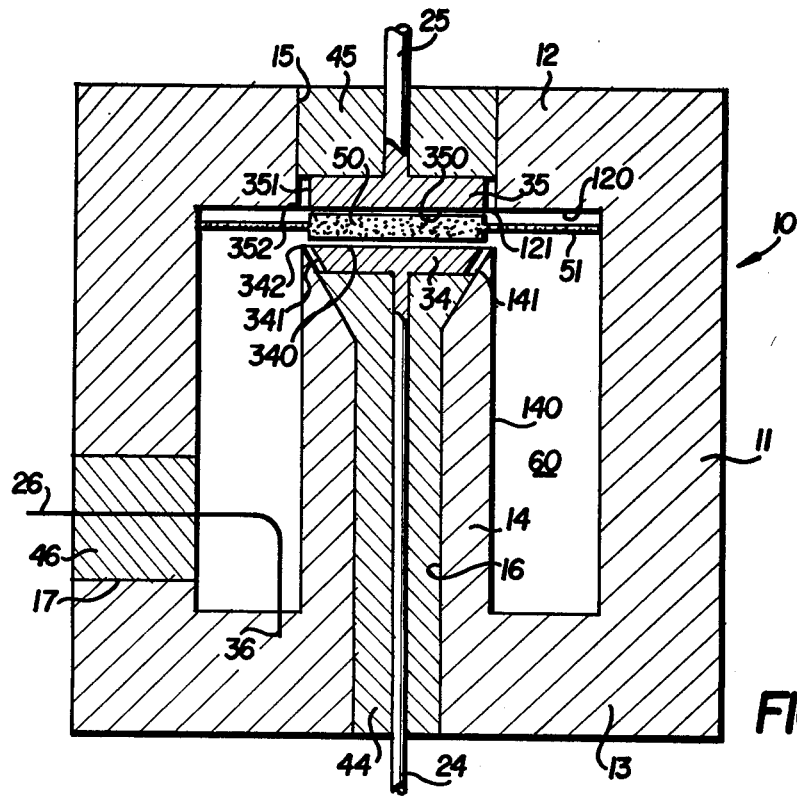
FIG. 1 is an outline view, axial cross-section, of a warmup device according to the invention, consisting of a re-entrant resonant cavity adapted to a resonator with electrodes not adhering to the crystal.
Figure 4:
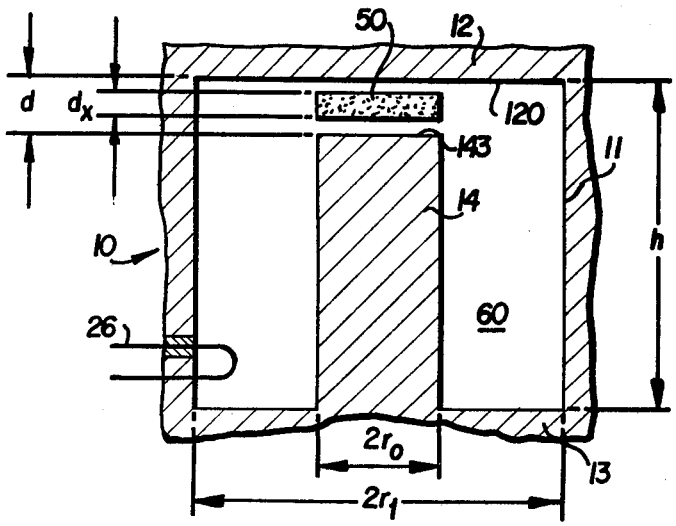
Figure 3:
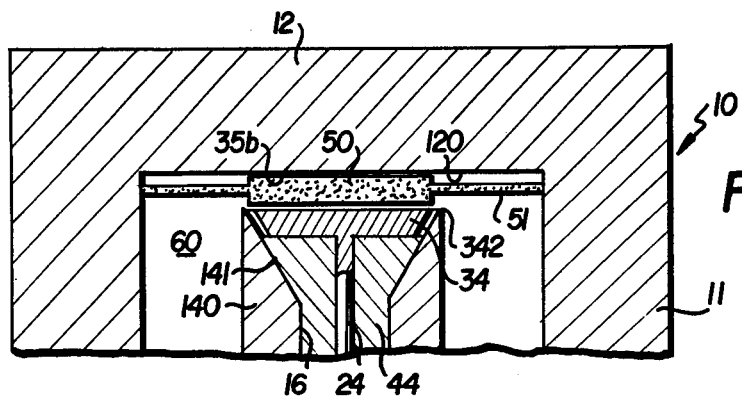
Figure 5A:
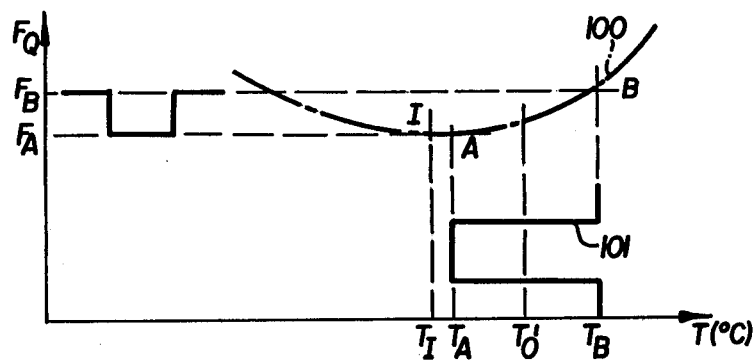
Figure 5B:
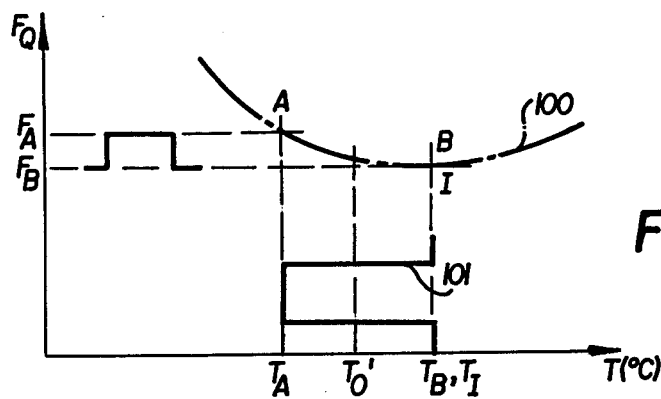
Figure 5C:
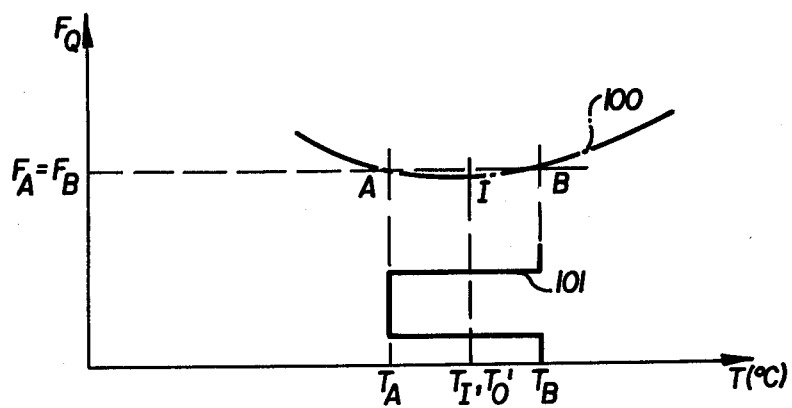

FIG. 3 is a partial outline view, axial cross-section, showing another alternative version of the device in FIG. 1 adapted to a parallel energizaton type resonator FIG. 4 is an outline view of a conventional resonance cavity and FIGS. 5a and 5c are diagrams showing curves providing the resonance frequency FQ of the resonator contingent on the temperature and the influence of modulation of the microwave electric field frequency.

FIG. 1 provides an outline and enlarged view of a microwave oven according to the invention, designed to warm up and hold a piezoelectric crystal HF resonator at a given temperature.

The microwave oven basically consists of a re-entrant cavity 10 forming a resonant circuit. The quartz crystal 50 which forms the vibrating active element of the HF resonator is itself installed in the free space, referred to as "gap", located between the central core 14 and the bottom 12 of cavity 10.

FIG. 4 provides an outline of a conventional re-entrant cavity 10 comprising a metal external structure consisting of a cylindrical side section 11, a first front section 12 defining the bottom of the cavity and a second front section 13, which is extended by a solid cylindrical central core 14 which penetrates into the internal free space 60 of the cavity remaining coaxial to the external cylindrical side section 11. The central core 14 connected to section 13 terminates on the side opposite by a free end 143, located close to the bottom 12 of the cavity. The free space between the terminal face 143 of central core 14 and the internal wall 120 of the bottom 12 of the cavity is the center of a normal electric field on face 143 and the wall of bottom 12.

The re-entrant cavity 10 in FIG. 4 thus forms a portion of closed coaxial line with an external conductor 11, and a central conductor 14. The latter, which is broken at one of its ends, defines a first armature 143 whereas the upper part 12 of the cavity which is an end of the coaxial line, forms with its internal section 120 a second armature 120 coupled electrically to the external conductor 11. The electric field is radial in the internal space of the re-entrant cavity located between the central conductor 14 and the external conductor 11, whereas in the free space between the lower armature 143 and upper armature 120 of the end of line 12 forming a base or cover for the re-entrant cavity, the electric field is normal on the armatures. Re-entrant cavity 10 is also equipped with one or several coupling loops installed in its lower section, coupled to a UHF oscillator and producing a resonance in the cavity. The resonance curve corresponds to a range of frequencies whose values are determined by the geometric configuration of the cavity 10. Moreover, the UHF electric field produced in the cavity is concentrated in highly homogeneous form, at about 80% in the inter-armature space between armatures 143 and 120.

A re-entrant cavity 10 thus performs in the same way as the resonance circuit, and components r, L,C of the equivalent electric circuit can be estimated, contingent on the geometrical dimensions of the cavity, using the following formulae produced by FUJISAWA:

$$L = (2\pi)^{-1} \mu_o h \, \mathrm{Log} \frac{r_1}{r_o} \quad (1)$$

$$C = \frac{\epsilon_o \pi r_o^2}{\Delta + d_x \epsilon_r^{-1}} \quad (\Delta = d - d_x) \quad (2)$$

$$r = \frac{1}{2\pi\delta\sigma} \left( \frac{h-d}{r_o} + \frac{h}{r_1} + 2 \, \mathrm{Log} \frac{r_1}{r_o} \right) \quad (3)$$

where δ corresponds to the depth of the skin effect, V the electrical conductivity of the walls, ro to the radius of the central core 14, rl to the radius of the internal wall of external conductor 11, h the distance between the internal faces of the front section 12 and 13, d the distance between armatures 143 and 120, $d_x$ the thickness of the dielectric element 15 installed between armatures 143 and 120, $\mu_o$ is the magnetic permeability of the void, $\epsilon_o$ is the dielectric permitivity of the void and $\epsilon_r$ is the dielectric constant of the dielectric element 50 (quartz crystal).

The frequency F of the cavity together with its quality factor Q can be thus easily determined. Example:

| $r_0$ (m) | $r_1$ (m) | h (m) | d (m) | F (GHz) | r (Ω) | Q |
|---|---|---|---|---|---|---|
| $2,5.10^{-3}$ | $6,5.10^{-3}$ | $13.10^{-3}$ | $0,1.10^{-3}$ | 5 | 0,02 | 2.100 |

According to the invention, a re-entrant cavity 10 is thus employed to produce a microwave electric field whose frequency F is much higher than the resonance frequency FQ of the HF resonator to be warmed up. The HF resonator can thus be inserted in the interarmature space between the terminal section 143 of central core 14 and the internal face 120 of the bottom 12 of cavity, and subjected to an intense and homogeneous microwave electric field, for example around 3 GHz, which does not energize piezoelectric vibrations in the quartz crystal of the HF resonator owing to the great difference between the resonance frequency FQ of the crystal and the frequency F of the microwave field so that the frequency F of the microwave electric field must be at least about ten times higher than the resonance frequency FQ of crystal 50 to prevent any coupling.

By the very fact that frequency F of the warm-up UHF electric field does not interfere with the piezoelectric effect in crystal 50, given that it is not resonant for this crystal, warm-up can be produced entirely by the bias effect of the dielectric. It is a well known fact that the molecule of a dielectric placed in an electric field acquires a more or less considerable electric moment (bias). The application of an alternating field produces a continual flipping of the electric charges causing dissipation of electric energy which develops in heat form. The release occurs right throughout the mass quite independent of any thermal conductibility, thus providing excellent homogeneity.

Th angle of loss which is a factor tied to the nature of the dielectric material characterizes, with the frequency F of the electric field, the capacity of the material to dissipate the heat, and defines with frequency F of the electric field, the warm-up efficiency. We thus obtain:

$$(P_c/P_{em}) = \pi F \cdot \tan \delta \quad (4)$$

where F is the frequency of the electric field,
$\delta$ is the angle of loss of the dielectric material
Pem is the power stored per cycle
Pc is the mean power dissipated in the dielectric.

Moreover, the complex power $\overline{P_G}$ supplied to the application circuit of the electric field is expressed by:

$$\overline{P_G} = P_c - 2j\omega P_{em} \quad (5)$$

where $\omega = 2\pi F$.

In the event of the microwave warm-up electric field being applied to the armatures of a capacitor containing an HF resonator, and for which the armatures coincide with the HF resonator electrodes, the output $\rho$ between the power $\overline{P_G}$ supplied by the UHF generator and the power Pc dissipated in the quartz crystal of the HF resonator can be expressed with a correct approximation by the following formula:

$$\rho = \frac{P_c}{|\overline{P_G}|} = \tan \delta \quad (6)$$

In the case of a quartz crystal in which $\tan\delta \simeq 2.10^{-4}$, the output $\rho$ thus remains very low.

Within the context of this invention, the warm-up microwave electric field is always applied via a resonant cavity 10. Thus the capacitor formed of the HF resonator is built into the serial resonant circuit defined by the resonant cavity, so that a voltage surge Io on the resonance can be taken advantage of, which is tied to the voltage surge coefficient of the cavity.

If Qo is the overvoltage coefficient of the resonant cavity without dielectric Q the overvoltage coefficient of the resonant cavity when a delectric such as crystal 50 is built in, the output $\rho$ is expressed as follows:

$$\rho = \frac{P_c}{P_G} = Q \tan\delta \simeq Q_o \tan\delta \quad (7)$$

The use of a resonant cavity can thus multiply the output by a factor Q which can be easily in the region of $10^3$ with an ordinary quality cavity.

In these conditions, and despite the low value of tan $\delta$ for a material such as quartz crystal, it is possible to obtain an output $\rho$ which is for example in the region of 0.2. Consequently, a moderated power $P_G$ of around 1 W can produce a warm-up power Pc of around 200 mw. Now it has been established that for an HF resonator, the temperature build-up speed of the quartz is provided by the following relation:

$$v = \frac{P_c}{cV} \, oK/\text{second} \quad (8)$$

in which Pc is the warm-up power, see the specific voluminal heat of the quartz crystal, V the volume of the quartz crystal.

Moreover, the maintenance power Pc required to compensate for the heat transfers from the quartz crystal to the ambient environment, which basically takes place by radiation, can be expressed by:

$$P_c = C_r(T_q - T_a) \quad (9)$$

in which Cr is the conductibility of the quartz crystal
Tq is the temperature of the quartz crystal
Ta is the ambient temperature.

Relations (8) and (9) can only be deduced with a moderated power $P_G$ of 1 W and with a quartz crystal of average volume V (for example V=9 mm$^3$), a warm-up speed of around 1° K./second can be obtained quite easily likewise subsequently maintenance of the crystal at a predetermined temperature despite the radiation losses, the maintenance power Pe can be in the region of 80 mW to maintain it at a temperature different by some dozen degrees from the ambient temperature and naturally well below if special precautions are taken to insulate the resonator thermally. Now, as was indicated above, a power of 1 W provided by a UHF oscillator can apply a warm-up power which can be, for example, in the region of 200 MW, and is thus well above the warm-up powers required to obtain ultra-fast warm-up of a crystal and hence the maintenance of this crystal at a predetermined temperature, such as the turn point temperature which can be, for example, around 65° C.

Figure 2:
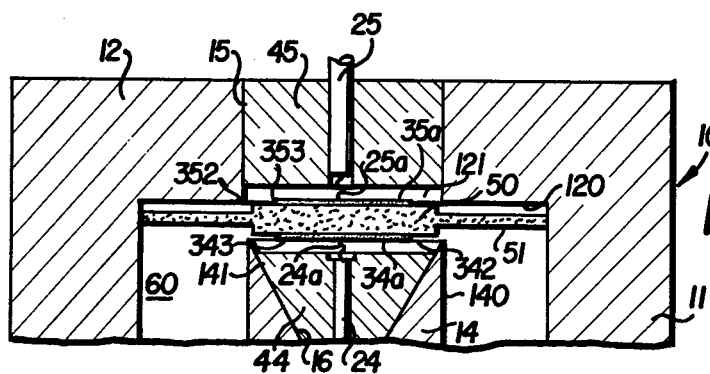
FIG. 2 is a partial outline view, axial cross-section, of an alternative version of the device in FIG. 1, adapted to a resonator with electrodes adhering to the crystal.

With reference to FIGS. 1 to 3, we shall now describe the specific structure of the resonant cavity 10 adapted so as not only to apply the microwave warm-up electric field, but also to apply an HF electric field to the resonator built in to cavity 10.

Resonant cavity 10 in FIG. 1 complies with the diagram in FIG. 4 inasfar as it comprises a conductor cylindrical package 11, to front faces 12 and 13, a central core 14 comprising an external conductor cylindrical section 140 broken at a distance from internal face 120 from bottom 12 and coupling loop 26 whose end inserted into a bore 17 in the side wall 11 of the cavity and insulated from the latter by insulating electrical material 46 is coupled to a UHF oscillator, not shown, and the other end 36 is coupled to the ground by a bottom 13 of cavity 10. A piezoelectric crystal 50 is, moreover, installed in the space located between the free end of central core 14 and the bottom 12 of the cavity, as if cavity 10 were to be used to energize a piezoelectric vibration of crystal 50. Nevertheless, the thickness of crystal 50 used within the context of this invention is naturally well above that of a crystal designed to resonate at very high frequencies, because crystal 50 should be part of an HF resonator and is only placed in a resonant cavity for warm-up requirements.

There is, nevertheless, an essential difference between cavity 10 in FIG. 1 and the cavity in FIG. 4. Thus, in the case of FIG. 1, the conductor cavity 10 which is, revolutionwise, drilled on either side in its central section so as to define two axial bores 15.16 on one side in bottom 12 of the cavity and in the other, in the central core 14 and the second frontal section 13, on either side of crystal 50. Two electrodes 34, 35 are inserted into bores 16 and 15 respectively and have a surface 340, 350 respectively which is opposite the active section of the crystal, without any contact with the crystal, but at a short distance from it. These electrodes 34,35 apply to crystal 50 the HF electric field required to energize a piezoelectric vibration useful to the latter at a resonance frequency FQ. The distance between the surfaces 340 and 350 is thus contingent on the choice of the frequency FQ.

The geometrical configuration of resonant cavity 10 is thus established in such a way that the surfaces 340 and 350 of electrodes 34 and 35 are practically in the same plane as, respectively, the free end 342 of the external conductor section 140 of core 50 and the internal surface 120 of bottom 12 of the cavity.

The electrodes 34, 35 are connected to central conductors 24, 25 inserted into bores 16, 15 respectively. Linings 44, 45 in insulating material are inserted into bores 16,15 respectively so as to insulate conductors 24,25 of conductor sections 140, 13 and 12 of cavity 10. Conductors 24, 25 couple electrodes 34, 35 to an external HF oscillator not shown, so as to provide energy required to create an electric field energizing the resonance frequency FQ.

According to an important feature of the invention, the peripheral side faces 342, 352 of the plates defining electrodes 34,35 respectively, are not in contact with the conductor walls of bores 16,15 respectively, but located at a short distance from the latter so that they are defined between electrodes 34,35 and the walls of cavity 10 which are opposite those of the capacitances whose impedance is low for the very high frequencies of the microwaves field, but high for the high frequency field to which the resonance frequency FQ of piezoelectric crystal 50 belongs. In this way, the application of the HF electric field to frequency FQ for electrodes 34,35 can well be obtained without the adjacent conductor sections 140, 12, disturbing this HF electric field. In the same way, the fact that the breaks obtained between conductor sections 140,12 respectively, and electrodes 34, 35 are of a relatively low thickness, enabling electrodes 34,35 to play a dual part ensuring also the application of the UHF electric field in the space in which piezo crystal 50 is located. The break 120 located between edge 351 of bore 15 and surface 350 of electrode 35 is in fact not operative versus ultrahigh frequencies. Likewise, the break obtained between the free terminal end 342 of the external conductor section 140 of central core 14 and the surface 340 of electrode 34 is inoperative versus the frequencies of the UHF electric field. As to the application of the microwave electric field, everything thus happens as if the cavity 10 in FIG. 1 duly had the structure outlined in FIG. 4.

Piezoelectric crystal 50 is preferably of a type comprising an active central section installed opposite electrodes 34, 35 and a peripheral support section 51 by which crystal 50 can be suspended between bottom 12 and central core 14 of re-entrant cavity 10. Crystal 50 can, for example, be supported by inserting peripheral section 51 in the cylindrical side wall 11 of re-entrant cavity 10. The peripheral section 51 can also lie on a dielectric block installed in the annular free space 60 of the cavity between central core 14 and side wall 11. The presence of dielectric material in the annular space 60 provides a support between the peripheral section 51 and also reduces the dimensions of the cavity (at constant frequency F) with a view to miniaturization.

According to a specific form of construction, the external conductor section 140 of central core 14 has a thin upper section, the axial bore 16 terminating in a flared portion 141 in truncated cone form whose broad base 342 forms the free end of the external conductor section 140. In this case, electrode 34 itself has a truncated cone form, section 341 of electrode 34 being located at a short distance from the upper part 141 of bore 16, but without any contact with this upper part 141. This configuration extends the external conductor section 140 as far as plane 340 of the surface of electrode 34a opposite crystal 50, without the terminal portion of section 140 around electrode 34a being too fragilized.

FIG. 2 shows another method of construction along which an HF resonator is employed with electrodes 34a, 35a, adhering to the crystal. According to this mode of construction, electrodes, 34a, 35a, are deposited directly on the two opposing faces of crystal 50, in a well known fashion, so as to define a resonator whose resonance frequency depends on the thickness of the crystal. Crystal 50 is located in relation to cavity 50 via its peripheral section 51 so that electrodes 34a, 35a are both opposite bores 16, 15 respectively, as in the case of FIG. 1, in core 14 and bottom 12 respectively, and practically in the plane of the free end 342 of the external section 140 of core 14 and in the plane of the inner face of 120 of bottom 12 respectively. The similar elements in the methods of construction in FIGS. 1 and 2 have the same numerical references.

Thus, bores 16, 15 in FIG. 2 comprise as in the case of FIG. 1, linings in insulating material 44, 45 which create electrical insulation between the conductor sections 140, 12 of cavity 10 and the axial conductors 24,25 which couple electrodes 34a, 35a to an HF oscillator. In the case of the system in FIG. 2, the insulating material of linings 44, 45 has a free surface which is located somewhat set back from the respective edges 342, 352 of bores 16, 15 so as to avoid any contact between electrodes 34a, 35a, integral with the crystal and hence vibrating, and the insulating materials. Conductors 24,25 are themselves connected to electrodes 34a, 35a, by small flexible conductor leads 24a, 25a which do not in any way impede the vibrations of electrodes 34a, 35a.

As in the case in FIG. 1, the free spaces between peripheral 343, 353 of electrodes 34a, 35a and edges 342, 352 are of a size such that they define capacitances whose impedance is low for the very high frequencies of the microwave field but high for the high frequencies field. In this way, the application of the high frequency electrode field by electrodes 34a, 35a coupled by conductors 24,25 to the HF oscillator can be obtained easily and the UHF electric field can also be applied via electrodes 34a, 35a which, with the very high frequencies, form a continuity with conductor sections 140 and 120 respectively. The method of construction in FIG. 2 can, however, be considered as having a somewhat lower performance than that in FIG. 1, inasfar as electrodes 34a, 35a, coupled to the active section of crystal 50 also vibrate at the resonance frequency FQ of the crystal and can thus slightly disturb the microwave electric field. The efficiency of the microwave electric field is, however, not really affected given that the electric field energizing the crystal always remains at a relatively low level.

FIG. 3 shows an alternative version of the method of construction in FIG. 1, this version being adapted to an HF resonator with parallel energization in opposition to the methods of construction shown in FIGS. 1 and 2, adapted to HF resonators of serial energization type. On FIG. 2, central core 14 and lower electrode 34 fully conform to the description made in reference to FIG. 1. In return, on FIG. 3, the section forming the second electrode 35b is composed directly of the internal face 120 of bottom 12 of cavity 10 and this internal face 120 displays no discontinuity. As in the case of the methods of construction in FIGS. 1 and 2, section 35b playing the part of electrode for crystal 50, contributes to the application of a portion of the HF electric field and, moreover, the UHF electric field. The absence of any independent conductor for electrode 35b which is thus not electrically insulated from bottom 12, simply implies that electrode 35b is grounded by the package of resonance cavity 10, electrode 34 remaining coupled to an HF oscillator. Thus, the method of construction in FIG. 3 corresponds to an HF resonator with parallel energization which can thus be used in combination with a microwave warm up re-entrant cavity 10 in the same way as serial energization type HF resonators in the methods of construction shown in FIGS. 1 and 2.

Referring to FIG. 5a to 5c, a process of regulating the temperature of a quartz crystal 50 installed in a device complying with the invention as in FIGS. 1 to 3 will now be described.

As was indicated above (relation 4) with a given crystal 50 and a given re-entrant cavity 10, the warm-up power Pc supplied to crystal 50 by the UHF electric field of re-entrant cavity 10 is in proportion to the frequency F of the UHF oscillator driven by cavity 10. The resonance frequency FQ of crystal 50 itself depends on the internal temperature of crystal 50, hence on the warm-up power Pc. It is thus possible to use the HF signal delivered by the resonator as information relating to the temperature of the crystal and subsequently obtain servo-control of the UHF oscillator frequency on a predetermined temperature of the crystal such as the turn point temperature. For this purpose, the frequency of the UHF oscillator is modulated, by modulating the resonance frequency of cavity 10 via a modulating frequency, e.g. sinusoidal, which can be in the region of 10 to 1000 Hz, and which has a pulse $\Omega$. If $\Delta F$ corresponds to the frequency excursion and the pulsing of the UHF electric field, we obtain:

$$\omega = 2\pi(F + \Delta F \sin \Omega t) \quad (10)$$

The warm-up power Pc which is in proportion to $\Omega$ is itself modulated. Thus, in a dynamic state, crystal 50 stores the heat with a time constant $\tau_1$ which depends on $\Omega$ and which can be as short as around 1 ms, and restores heat to the ambient environment with a time constant $\tau_2$ normally above around 1 second, and which can be very much higher contingent on the insulation of the heating system in relation to the ambient environment. If Tqo designates the temperature of the crystal at static thermal balance, this temperature becoming Tq at the moment when the pulse $\Omega$ of the UHF frequency is modulated, if $\theta$ is the period of the modulation and if Tq is the ambient temperature, the following relations can be established:

$$\frac{Tq - Ta}{Tqo - Ta} = \frac{\Delta F}{F} \cdot \frac{\tau_2}{\theta} \quad (11)$$

($\theta/\tau_2$) being in all cases very well below the unit. FIGS. 5a to c display, in the mixed line, a curve 100 showing for a given quartz crystal, for example, a quartz crystal with cut AT, the resonance frequency FQ of the crystal contingent on its internal temperature T in °Celsius. Curve 100 shows a minimum or turn around point I corresponding to a predetermined temperature, for example 65° C.

When the frequency of the UHF oscillator is modulated to a frequency $\Omega$, via a slot modulation, the warm-up power Pc is modulated in the same way, and the temperature T of the crystal evolves around a point of curve 100, corresponding to a temperature T'o, between 2 points A and B. The result is that frequency FQ of the quartz crystal is itself modulated when temperature T oscillates between the temperature of point A and that of point B subsequent to the modulation of the warm-up power (FIGS. 5a and b). Thus on FIG. 5a, temperature TA of point A and temperature TB of point B are both higher than the turn around temperature $T_I$ of the crystal. Owing to the fact that the mean temperature T'o is higher than the turn around temperature $T_I$, frequency SB corresponding to turn around point B is higher than frequency FA corresponding to point A. On FIG. 5b, temperature T'o is lower than the turn around temperature $E_I$. Frequency $F_A$ then drops below frequency $F_B$. As for FIG. 5c, in which the temperature T'o corresponds to the turn around temperature $E_I$, it shows that points A and B are symmetric in relation at a turn around point I and that frequency FA is equal to frequency FB.

Through the modulation of the frequency of the hyperfrequency oscillator, and by slightly varying the basic hyperfrequency frequency, it is thus possible, through detection of the modulated signal FQ, supplied by the HF resonator, to detect a change in phase of this modulated signal and to servo-control the frequency of the hyperfrequency oscillator so that ordinates FA and FB of points A and B are equal. This thus obtains the balance point of the servo-control and the temperature of the crystal can be maintained at the turn around temperature with a minimum energy expenditure and with a guarantee of excellent stability for the resonance frequency FQ of the HF resonator.

If formula (11) given above, is further considered, two possible cases can arise. In the first case, ratio $R = Tq = Ta/Tqo - Ta$, is around the unit. This condition corresponds to a quartz resonator with little insulation, and values, for example, such as $\tau_2 = 1$ second, $\theta = 10^{-3}$ seconds, $\Delta F = 3.10^6$ Hz, or still again, a relatively well insulated quartz crystal resonator with, for example, values such as $\tau_2 = 100$ seconds, $\theta = 10^{-2}$ seconds, $\Delta F = 3.10^5$ Hz. In this case, it is possible to obtain a temperature regulation of the crystal in the way described previously by using the law of dynamic frequency-temperture variations. In the second case, the ratio $R = Tq - Ta/Tqo - Ta$ is very well above the unit. This condition assumes that the crystal is relatively well insulated with, for example, values such as $\tau_2 = 10^3$ seconds, $\theta = 10^{-3}$ seconds, $\Delta F = 3.10^6$ Hz, which implies $R = 10^3$. In this case, it can be seen that the invention brings the temperature of the crystal up to a very high value, which can be especially useful in certain applications. This case of very high ratio R also provides for the maintenance of a quartz crystal at its turn around temperature, expending very slight power in the region, for example, of 0.1 mW, if remaining in dynamic state. In fact, with a ratio $R = 10^{-3}$ and a power $Pc = 10^{-1}$ mW, it is possible for example to maintain the following deviations:

$$Tqo - Ta \simeq 5.10^{-2} °K.$$

$$Tq - Ta \simeq 50° K.$$

This invention thus not only provides for ultra-fast and homogeneous warm-up of an HF resonator placing it in a microwave resonant cavity for types described above, but also, via this same cavity, produces a quartz thermostat operating permanently and only consuming a few milliwatts, inasfar as modulation is applied, for example by slots, of the frequency of the microwave electric field and the cavity is thermally insulated from the ambient environment. Resonant cavity 10 can, for example, simply be placed in a tight package in which a vacuum has been applied, so as to reduce the losses through radiation. It will be noted that the modulation of the frequency of the microwave electric field obtains automatic and quite exact location of the turn around point of a crystal, limiting the frequency trailings of the HF resonator which are latent in other modes of regulating conventional thermostats on which there is a servo-control of a temperature which is never strictly the turn around temperature. Naturally, various changes and additions can be made to the devices described without coming outside the context of the invention. So that, for example, the plates defining electrodes 34, 35 not adhering to crystal 50 need not necessarily be produced in conductor material. On the contrary, plates 34, 35 can be composed of dielectric material in which only faces 340, 350 located opposite crystal 50 together with the parts of the peripheral surfaces 341, 351 and the rear faces facing insulating material 44, 45 are bonded to obtain the active electrode surfaces 340, 350 coupled to linkage conductors 24, 25 via conductor paths deposited on plates 34, 35.

We claim:

1. A method for fast warm-up of a HF resonator, said resonator comprising a piezoeletric crystal which cooperates with at least a pair of energizer electrodes generating a HF electric field to enter into resonance at a predetermined frequency FQ, said method comprising the step of creating a supplementary UHF electric field around said resonator having a frequency F higher than said resonance frequency FQ of said resonator.

2. The method according to claim 1, wherein said frequency F of the UHF electric field is at least equal to approximately ten times the resonance frequency FQ of the resonator.

3. The method according to claim 1 or 2, comprising the further steps of frequency modulating said supplementary UHF electric field; detecting the induced modulation in the resonance frequency FQ of the piezoelectric crystal; and controlling the frequency F of said supplementary UHF electric field contingent on the modulation signal detected of resonance frequency FQ so as to maintain said detected modulation signal at a minimum level, and thereby raise said resonator to a predetermined turn around temperature and maintain said turn around temperature substantially constant.

4. The method according to claim 3 wherein the UHF electric field is modulated via a modulated signal in gated form.

5. A microwave warm up device for a HF resonator, comprising a piezoelectric crystal cooperating with first and second energizer electrodes producing a HF first electric field for energizing said crystal to resonate at a resonance frequency FQ, wherein said device comprises a re-entrant resonant cavity having a first conductor section defining a cavity bottom and having a central core spaced from said cavity bottom, said core comprising a second conductor section, said cavity driving a UHF oscillator and sized so as to produce a UHF second electric field of frequency F higher than said resonance frequency FQ, said HF resonator being installed in the space between said central core and said cavity bottom such that an end of said first electrode is substantially coplanar with the free end of said central core and an end of said second electrode is substantially coplanar with the internal face of said cavity bottom, and such that at least one of said electrodes is disposed in a corresponding at least one bore formed in the corresponding one of said first conductor section and said central core, said at least one bore having an axis which is substantially perpendicular to a plane defined by said crystal, and the peripheral surface of said at least one electrode being surrounded proximately, but without contact, by the wall of said at least one bore, said device further comprising a corresponding at least one internal conductor coaxially disposed within said at least one bore and insulated therefrom by a corresponding lining of insulating material for coupling said at least one electrode to an HF oscillator designed to apply to said resonator a resonance electric field at said frequency FQ.

6. The device according to claim 5 wherein said first electrode constitutes said at least one electrode.

7. The device according to claim 5 wherein at least a portion of said central core including the terminal face thereof or at least a portion of said cavity bottom including the internal face thereof is grounded and constitutes one of said electrodes, and wherein said HF resonator is a parallel energization type.

8. The device according to claim 6 wherein said second electrode constitutes said at least one electrode and said HF resonator is a serial energization type.

9. The device according to claim 5 wherein said electrodes are integral with the faces of said crystal facing respectively, the free end of said central core and said cavity bottom.

10. The device according to claim 5 wherein said electrodes are in the form of plates disposed proximate to, but spaced from the corresponding ones of said faces of said crystal.

11. The device according to claim 6 wherein a terminal portion of said bore at the free end of said core is flared radially outwardly.

12. The device according to claim 5 wherein the space provided between said at least one electrode and the wall of said corresponding at leat one bore defines a capacitance having a impedance which is low at said frequency F but which is high at said resonance frequency FQ.

13. The device according to claim 12 wherein said frequency F is between approximately 500 MHz and 10 GHz.

14. The device according to claim 13 wherein the ratio between said frequency F and said resonance freuency FQ is at least approximately 10.

15. The device according to claim 14 further comprising means for modulating said frequency F of said second electric field, means for detecting the modulation induced in said resonance frequency FQ and means for controlling said frequency F contingent on the modulation signal detected by said detecting means to maintain the modulation signal detected below a predetermined level and thereby obtain regulation of the temperature of said crystal.

16. The device according to claim 15 wherein said re-entrant resonant cavity is disposed in a vacuum enclosure.

17. The device according to claim 16 wherein said UHF oscillator driven by said resonant cavity supplies more than a hundred milliwatts of power.

18. The method according to claim 4 wherein said piezoelectric crystal is a quartz crystal.

* * * * *